United States Patent
Huang

(10) Patent No.: US 7,196,401 B2
(45) Date of Patent: Mar. 27, 2007

(54) CHIP-PACKAGING WITH BONDING OPTIONS HAVING A PLURALITY OF PACKAGE SUBSTRATES

(75) Inventor: Cheng-Yen Huang, Hsin-Chu (TW)

(73) Assignee: Faraday Technology Corp., Hsin-Chu (TW)

( * ) Notice: Subject to any disclaimer, the term of this patent is extended or adjusted under 35 U.S.C. 154(b) by 85 days.

(21) Appl. No.: 10/709,427

(22) Filed: May 5, 2004

(65) Prior Publication Data

US 2005/0248016 A1 Nov. 10, 2005

(51) Int. Cl.
*H01L 23/495* (2006.01)
(52) U.S. Cl. .................. 257/666; 257/786
(58) Field of Classification Search ......... 257/685, 257/666, 676, 786, 207, 691
See application file for complete search history.

(56) References Cited

U.S. PATENT DOCUMENTS 6,339,252 B1* 1/2002 Niones et al. .......... 257/666
6,822,319 B1* 11/2004 Lau et al. ............... 257/676
6,995,460 B1* 2/2006 McLellan et al. ....... 257/676

* cited by examiner

*Primary Examiner*—Mark V. Prenty
(74) *Attorney, Agent, or Firm*—Winston Hsu

(57) ABSTRACT

Chip-packaging with bonding options having a plurality of package substrates. The chip-packaging includes first and second package substrates, a chip, and a lead. The chip having a plurality of bonding pads is mounted on the first package substrate. One of these bonding pads is connected to the first package substrate. Another bonding pad is connected to the second package substrate. The lead is connected to one bonding pad. The first and second package substrates have first and second voltages, respectfully. The first voltage and the second voltage are different, and each can be a GND voltage or a POWER voltage. With connection of these bonding pads with the lead or connection of these bonding pads with two package substrates, input ends or output ends in the chip could be connected to a GND voltage or a POWER voltage, or to one pin of the chip-packaging.

7 Claims, 8 Drawing Sheets

CHIP-PACKAGING WITH BONDING OPTIONS HAVING A PLURALITY OF PACKAGE SUBSTRATES

BACKGROUND OF INVENTION

1. Field of the Invention

The present invention relates to a chip-packaging, and more particularly, to a chip-packaging with bonding options having a plurality of package substrates.

2. Description of the Prior Art

In the modern VLSI circuit design, circuits in a package are connected to an outside power supply or other devices by a bonding mechanism. Therefore, allocations of bonding pads and methods of bonding options are basic and important technologies. In general, there are many different functions in one circuit, and there are many pins corresponding to the different functions in a circuit package. However, not all functions of the circuit are used, so some pins in the circuit package are connected to the outside circuits while others are not. Thus, some pins called Enable and Disable are provided. Pins having the function of Enable mean that when the pins are given a fixed high voltage (usually the voltage of the power supply), some functions corresponding to these pins in the chip are enabled. Similarly, pins having the function of Disable mean that some functions of the chip are disabled when the pins are given a fixed low voltage (usually the GND voltage). The Enable pins and the Disable pins allow make users to be able to choose the different functions of the chip so as to increase efficiency of the chip.

The method of providing a bonding option is used to provide Enable, Disable, and Input/Output options for some pins of a package. This method not only allows users to change the hardware configuration of VLSI circuits, but also to provide detecting and debugging of the VLSI circuits.

In the prior art, one bonding option usually comprises a plurality of bonding pads. These bonding pads provide different bonding choices. For example, a bonding pad can be connected to a high voltage pin (supply voltage) or a low voltage pin (ground). Previous architectures of the bonding options include two types: the value-default type and the power/ground proximity type. Please refer to FIG. 1 and FIG. 2. FIG. 1 and FIG. 2 illustrate an architecture of the bonding option of the value-default type. In the architecture, each bonding pad has is connected to a logic "1" of a high voltage or a logic "0" of a low voltage in the bonding option circuitry. If there is not any input signal applied to the pin of the bonding pad, the voltage of the pin will maintain a default voltage, which depends on what the pin is connected to. For example, the default voltage is high voltage "1" in the bonding option of the value-default type of FIG. 1. If the voltage of the pin is not defined by an outside system, the pin has logic "1". On the other hand, the default voltage is low voltage "0" in the bonding option of the value-default type of FIG. 2, and thus if the voltage of the pin is not defined by an outside system, the pin has logic "0".

Here we further state the principle of operations in FIG. 1 and FIG. 2. Please refer to FIG. 1. The bonding option device 12 of the value-default type in FIG. 1 comprises a passive circuit 10. The passive circuit 10 that is connected to POWER and the power supply consists of a PMOS. The passive circuit 10 has small resistance so that it has really high conductivity. When the passive circuit 10 turns on, the voltage drop between the drain and the source of the PMOS is almost zero. Therefore, POWER is set to the voltage of the power supply. In other words, when POWER is not input by outside signals, the passive circuit 10 turns on and POWER increases to a high voltage so that the inside circuitry will receive a signal of logic "1" from the bonding pad.

Please refer to FIG. 2. The bonding option device 16 of the value-default type FIG. 2 comprises a passive circuit 14. The passive circuit 10 that is connected to GND and the ground consists of a NMOS. The passive circuit 14 also has small resistance so that it has considerably high conductivity. When the passive circuit 14 turns on, the voltage drop between the drain and the source of the NMOS is almost zero. Therefore, GND is set to the voltage of the ground. Say, when GND is not applied by outside signals, the passive circuit 14 turns on and GND is forced to a low voltage so that the inside circuitry will receive a signal of logic "0" from the bonding pad.

However, the architecture has undesirable disadvantages. If one bonding pad of the architecture is applied by an input signal from an outside system and the input signal is different from the default voltage, it leads to additional power consumption. This disadvantage is serious in the modern electronic devices of small sizes.

Please refer to FIG. 3. FIG. 3 illustrates the well-known architecture 17 of the bonding option of the power/ground proximity type. The architecture comprises a plurality of bonding pads, and each bonding pad is adjacent to a POWER and a GND. These bonding pads do not have a default voltage. If one bonding pad must be connected to logic "1", the bonding pad is connected to POWER in FIG. 3. If one bonding pad must be connected to logic "0", the bonding pad is connected to GND. The architecture not only provides logic "1" or "0" for bonding pads but also avoids power waste. However, as described before, each bonding pad needs two connection points, POWER and GND for bonding choices, so these connection points and each bonding pad should be specially arranged. In the case of a chip with many pins, arrangement of the bonding pads becomes very troublesome.

SUMMARY OF INVENTION

It is therefore a primary objective of the claimed invention to provide a chip-packaging to solve the above-mentioned problems.

According to the claimed invention, a chip-packaging with bonding options having a plurality of package substrates comprises a first package substrate, a second package substrate, a chip comprising a plurality of the bonding pads and mounted on first package substrate wherein one bonding pad is connected to the first package substrate and another bonding pad is connected to the second package substrate, and a lead connected to one bonding pad.

These and other objectives of the present invention will no doubt become obvious to those of ordinary skill in the art after reading the following detailed description of the preferred embodiment that is illustrated in the various figures and drawings.

DETAILED DESCRIPTION

As mentioned in the prior art, usually one bonding option unit of a chip has to connect to three possible connection points: the ground, the power supply, and the bonding option. Because one chip often has different functions or configurations, some pins of the chip must be defined their voltage as Enable or Disable. Enable represents the high voltage of logic "1"(the power supply). If one pin of the chip is connected to the power supply, some function of the chip is enabled. In contrast, Disable represents the low voltage of logic "0"(the ground). If one pin of the chip is connected to the ground, some function of the chip is disabled. Application of Enable and Disable provides function selections of a chip and can be used as "1" or "0" of the testing signals.

Figure 1:
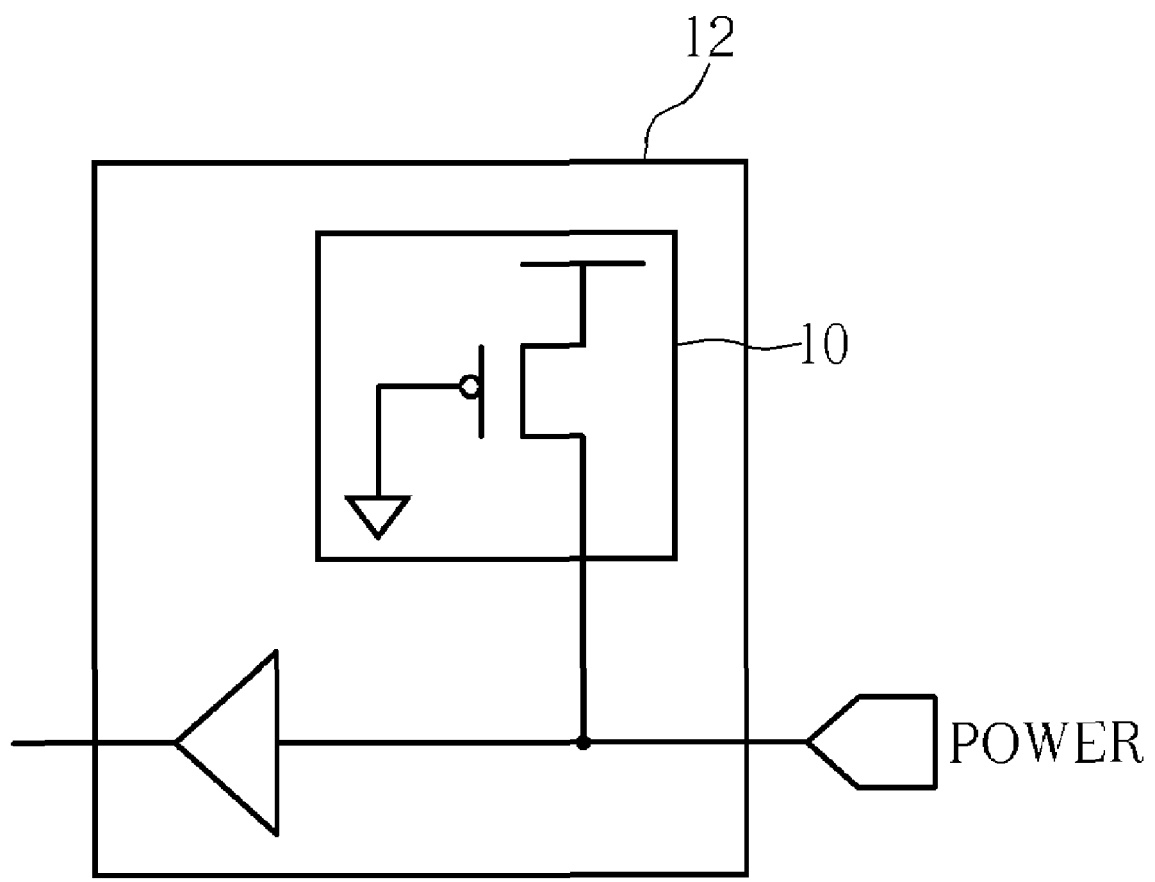
FIG. 1 illustrates an architecture of the bonding option of the value-default type.
Figure 2:
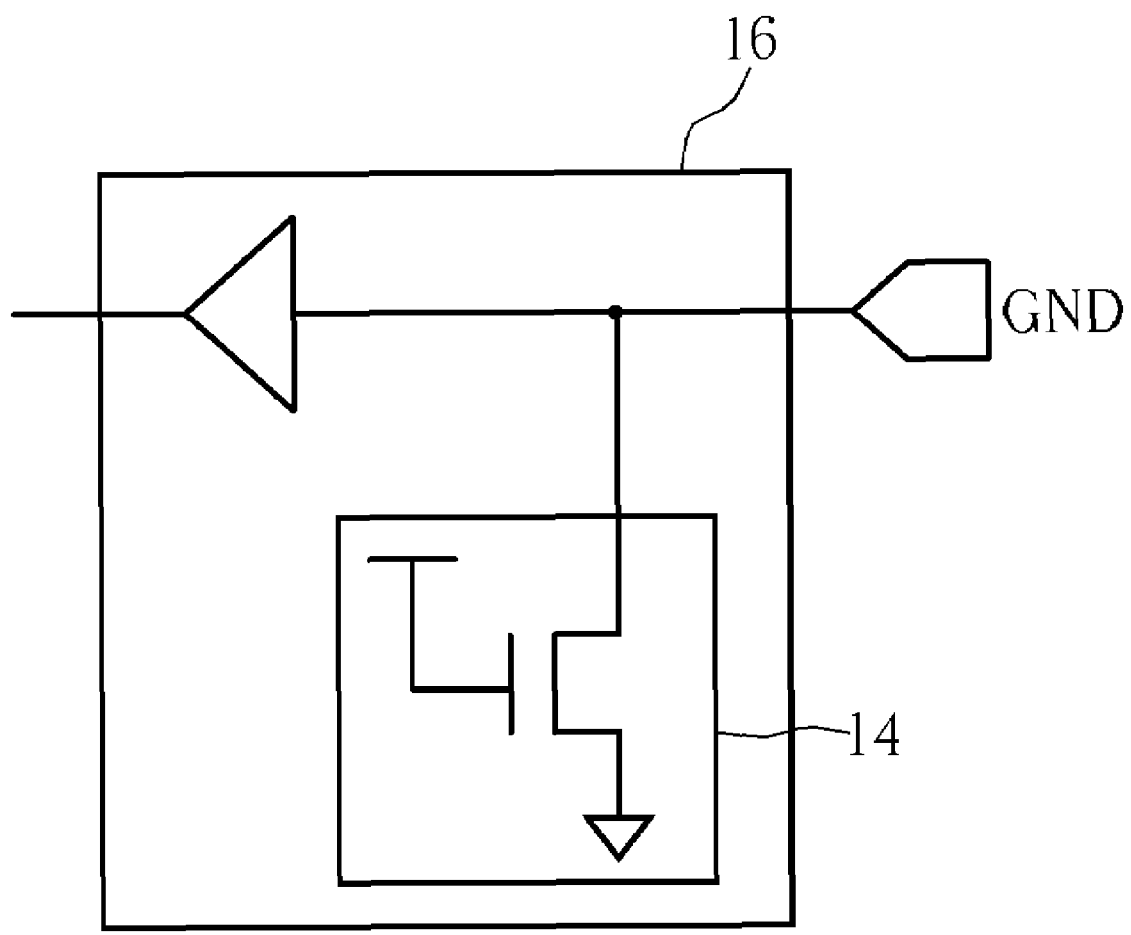
FIG. 2 illustrates an architecture of the bonding option of the value-default type.
Figure 3:
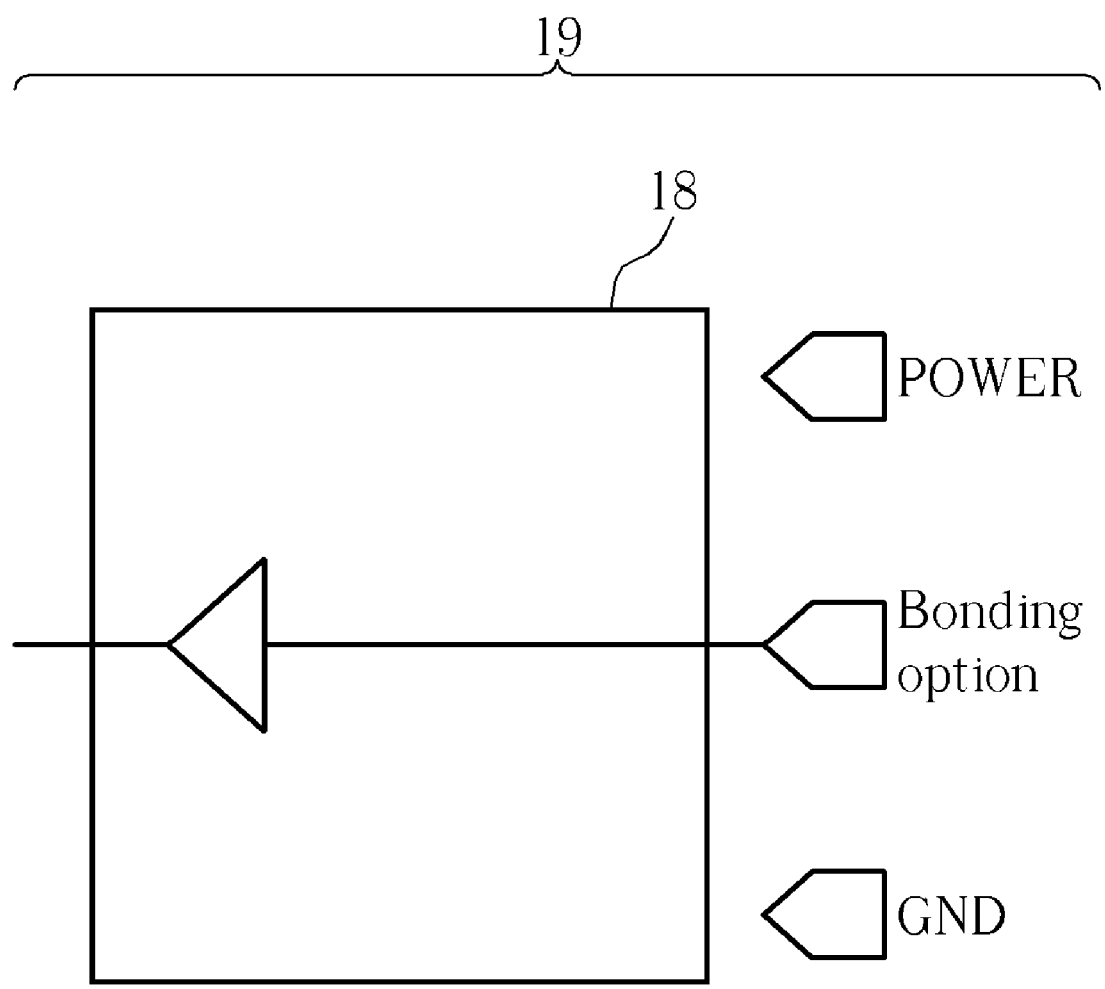
FIG. 3 illustrates the architecture of the bonding option of the power/ground proximity type according to the prior art.
Figure 4:
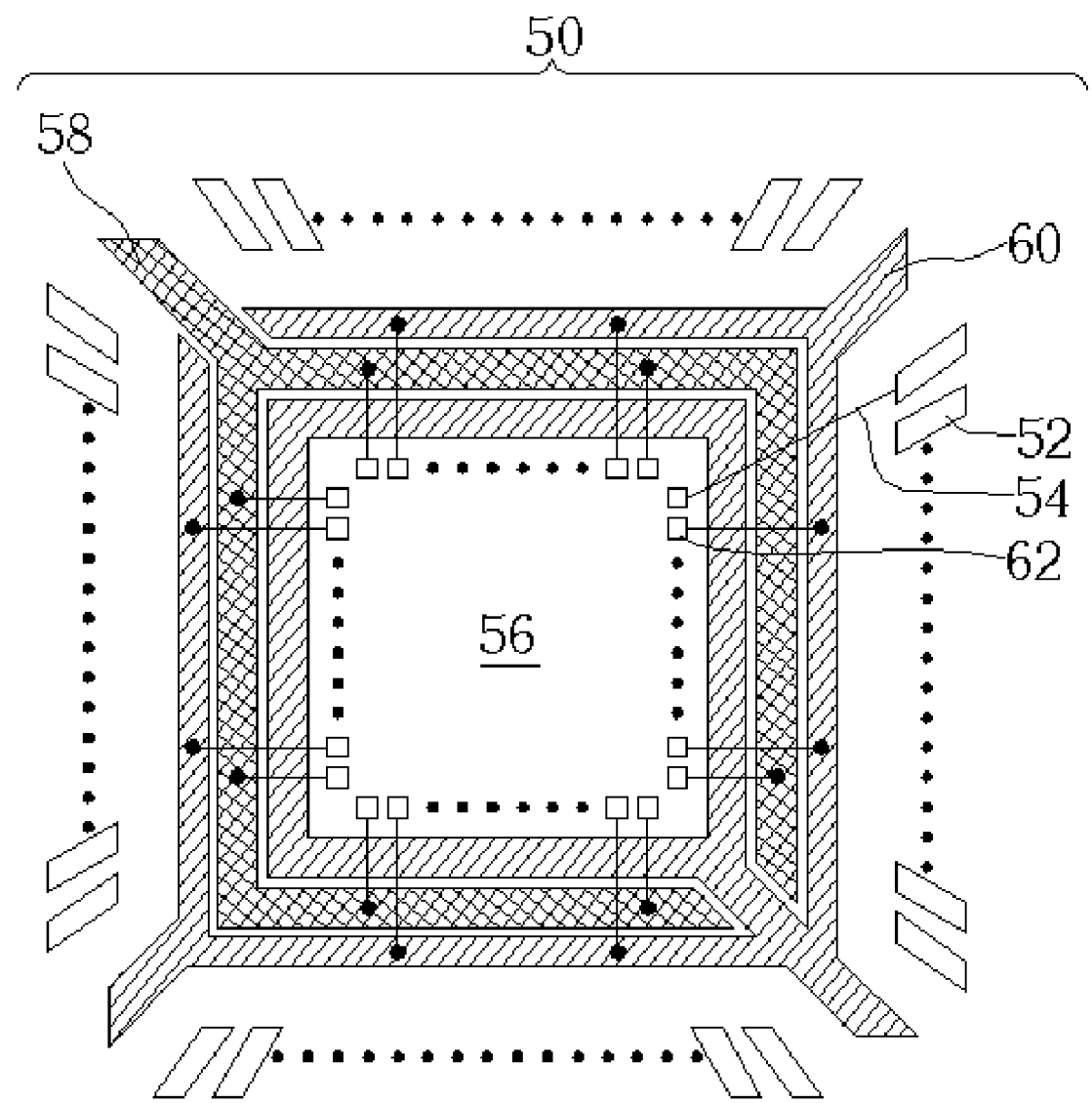
FIG. 4 illustrates the bonding option architecture providing three connection points for the bonding pads according to the present invention.

Please refer to FIG. 4. FIG. 4 illustrates the bonding option architecture 50 of the present invention providing three connection points for the bonding pads. The bonding option architecture 50 comprises a plurality of leads 52, a plurality of bonding wires 54, a chip 56, a first package substrate 58, and a second package substrate 60. The chip 56 comprises a plurality of bonding pads 62. The bonding pads 62 are set inside the chip 56 and surround the chip 56, providing the outlets of input/output ends of the chip 56. The leads 52 distributed around and outside the chip 56 are connected to the bonding pads 62 inside the chip 56 through bonding wires 54. The bonding pads 62 are like the connection points which connect the inside circuit of the chip 56 to the outside system while the leads 52 are like the connection points which connect the outside system to inside circuit of the chip 56. The bonding option architecture 50 lets the input/output signals of the chip communicate with outside circuitry and provides chip testing.

The first package substrate 58 and the second package substrate 60 are the bottom plates of the chip package. The shape of the package substrate is shown in FIG. 4. The chip 56 is mounted above the second package substrate 60, which the first package substrate 58 immediately surrounds. The outside periphery is the second package substrate which also surrounds the first package substrate. In this arrangement of package substrates, one can see at least one portion of the first package substrate 58 and at least one portion of the second package substrate 60 when looking outside from the chip in any direction. In other words, any bonding pad 62 approximates at least a portion of the first package substrate 58 and at least a portion of the second package substrate 60. Because a plurality of the leads 52 are distributed around the chip, the bonding pad 62 also approximates at least one lead. Two package substrates are used here for providing two different voltages to the bonding option, wherein one package substrate has a high voltage and the other has a low voltage. For example, the first package substrate 58 is applied to the power supply and the second package substrate 60 is applied to the ground voltage.

Figure 7:
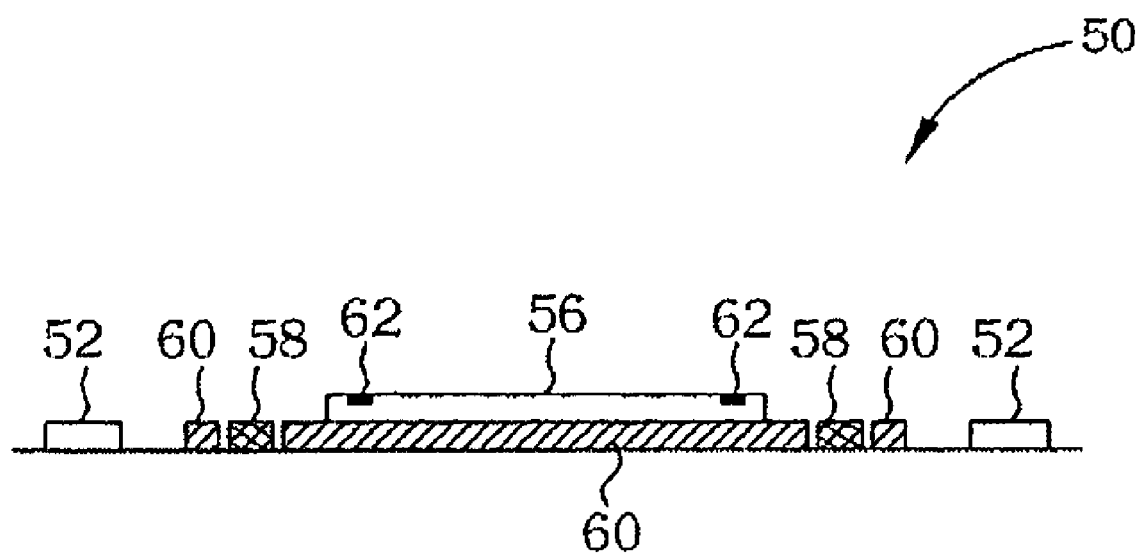
FIG. 7 is a cross-sectional view of the option architecture of FIG. 4.

Please refer to FIG. 7. FIG. 7 is a cross-sectional view of the option architecture 50 of FIG. 4. The chip 56 is shown mounted on the second package substrate 60, and the first package substrate 58 is formed in between sections of the second package substrate 60. The chip 56 contains the plurality of bonding pads 62 around the perimeter of the chip 56, and the leads 52 are formed around the perimeter of the second package substrate 60.

Figure 5:
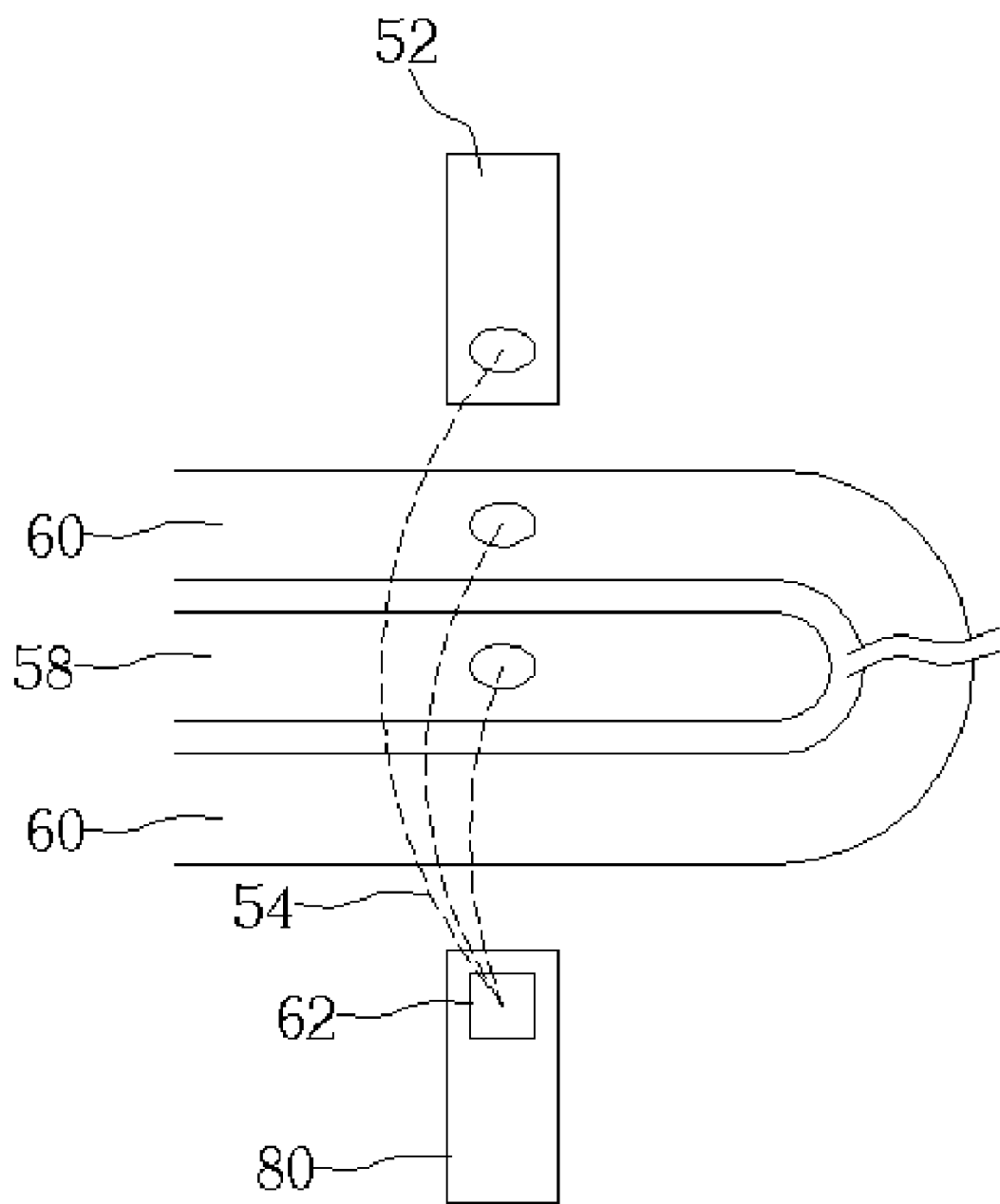
FIG. 5 illustrates the bonding option architecture of the present invention.

Please refer to FIG. 5. FIG. 5 illustrates the bonding option architecture of the present invention. The bonding option architecture in FIG. 5 is the detailed illustration of FIG. 4. Each marked item in FIG. 5 of the same names with those in FIG. 4 has the same functions. Besides, FIG. 5. further shows a bonding option unit 80. The bonding option unit 80 is connected to the inside circuitry of the chip 56, and the bonding pad 62 is included in the bonding option unit 80. As mentioned before, the bonding option unit 80 is possibly connected to Enable, Disable, or to the other systems. Therefore, there are three connection points: the lead 52 for the first bonding option, the first package substrate 60 for the second bonding option, and the second package substrate 58 for the third bonding option near the bonding pad 62. The first bonding option provides outlets for input/output signals of the chip 56. The second bonding option and the third bonding option provide the voltage of the power supply and the voltage of the ground. In the preferred embodiment of the present invention, the first package substrate 58 serving as the second bonding option provides the power supply while the second package substrate 60 serving as the third bonding option provides the ground. Of course, the voltages that two package substrates have can be exchanged. In this embodiment, when the bonding option unit 80 needs a voltage of the power supply, the bonding wire 54 connects the bonding pad 62 to the first package substrate 58 so that the voltage of the power supply is applied to the bonding option unit 80 and reaches the inside circuitry. In another case, when the bonding option unit 80 has to be connected to the ground, the bonding wire 54 connects the bonding pad 62 to the second package substrate 60 so that the bonding option unit 80 has the ground voltage. In the last case, the bonding option unit 80 is connected to the lead 52 through the bonding wire 54 for generating a transmission trace between the inside chip and the outside systems. Thus, the present invention utilizes only one lead to provide three functions of a bonding option, which not only removes the disadvantages of difficult arrangement of many leads in the prior art, but also lowers the production cost by reducing the number of leads.

Notice that the embodiment in FIG. 5 sets up a single lead 52 for each bonding option unit 80. In fact, the present invention can be implemented using only one lead for a bonding option. However, the number of leads for a single bonding option unit 80 is not limited to one. Designers are free to set up any amounts of leads for one bonding option unit for some special purpose. Moreover, the preferred embodiment of the present invention utilizes two package substrates. In reality, a plurality of package substrates can be provided for the bonding option. Change of the number of the leads for each bonding unit or the number of the package substrates is included in the claimed range of the present invention if they reach the similar effects of the present invention.

Figure 6:
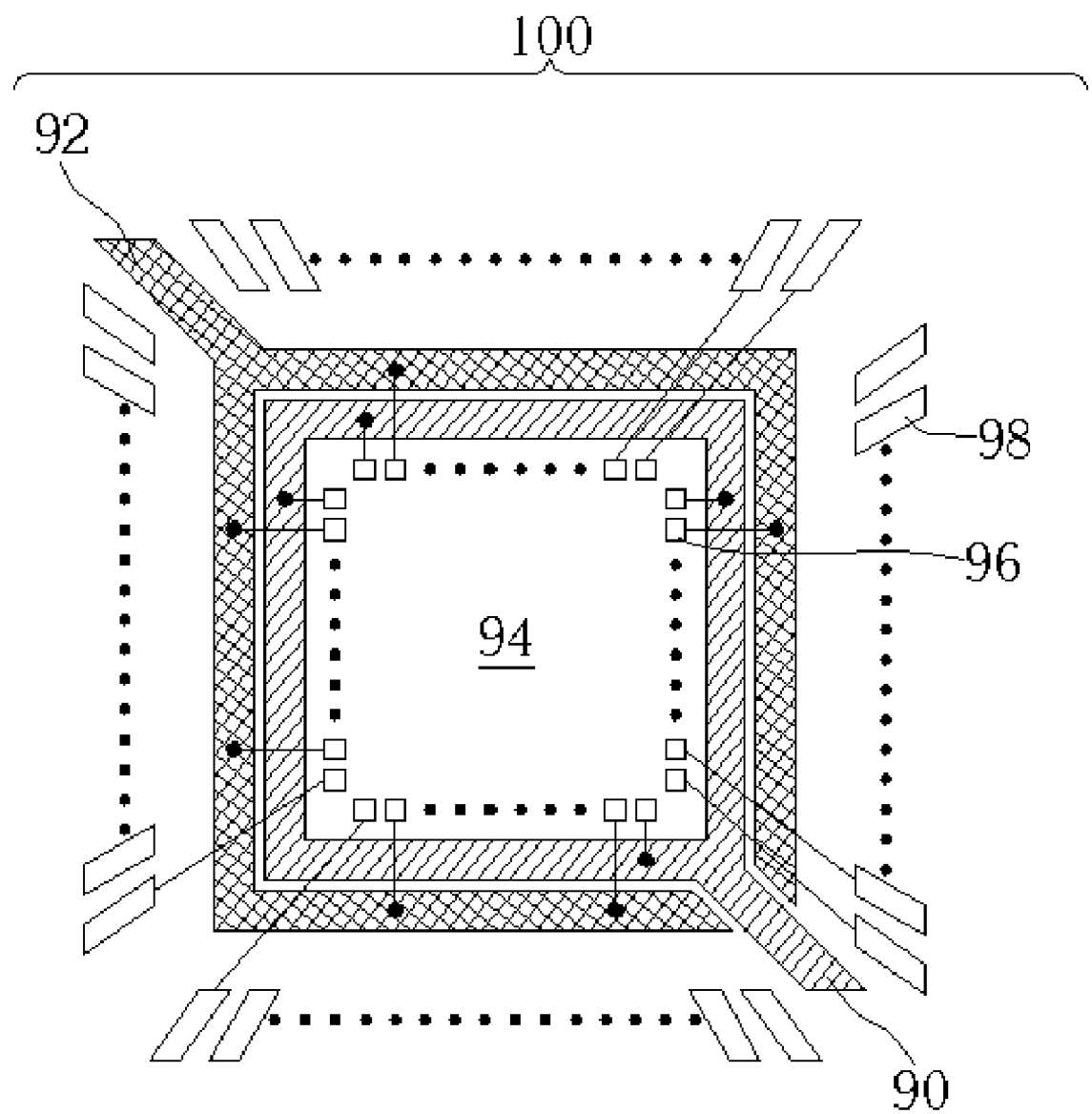
FIG. 6 illustrates another bonding option architecture.

Please refer to FIG. 6. FIG. 6 illustrates another bonding option architecture 100. In this embodiment, the shape of the package substrate is modified. The bonding option architecture 100 comprises a first package substrate 90, a second package substrate 92, a chip 94, a plurality of the bonding pads 96, and a plurality of leads 98. The shape of the first package substrate 90 is different from that in FIG. 4. The chip 94 is mounted on the first package substrate 90. The area of the first package substrate 90 is larger than that of the chip 94, and the first package substrate 90 extends outside the chip 94 so that the first package substrate 90 has enough area for a bonding wire to connect to. The second package substrate 92 surrounds the first package substrate 90, and a plurality of the leads 98 are set on the periphery of the package substrate. In the bonding option architecture in FIG. 6, each bonding pad 96 distributed around the chip 94 approximates three portions, which are the first package substrate 90, the second package substrate 92, and a lead 98. The three portions can be used as three connection points: the first bonding option, the second bonding option, and the third bonding option, for the bonding pad 96. The first package substrate and the second package substrate are connected to two different voltages, the power supply and the ground. The lead 98 serves as input/output outlets. Therefore, this embodiment implements functions of the bonding options. Of course, the package substrate has other changes in shapes, which is also included in the present invention.

Figure 8:
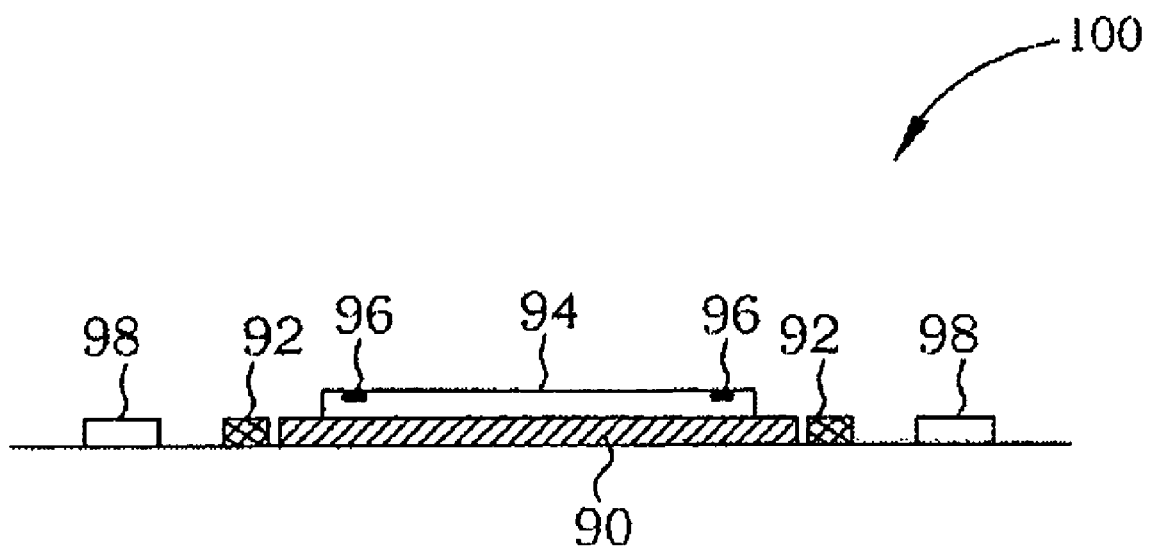
FIG. 8 is a cross-sectional view of the option architecture of FIG. 6.

Please refer to FIG. 8. FIG. 8 is a cross-sectional view of the option architecture 100 of FIG. 6. The chip 94 is shown mounted on the first package substrate 90, and the second package substrate 92 surrounds the first package substrate 90. The chip 94 contains the plurality of bonding pads 96 around the perimeter of the chip 94, and the leads 98 are formed around the perimeter of the second package substrate 92.

In the bonding option of the value-default type of the prior art, if one bonding pad of the architecture is applied by an input signal from an outside system and the input signal is different from the default voltage, it leads to additional power consumption. It is an unacceptable disadvantage in the modern electronic technology of low power. On other hand, the bonding option of the power/ground proximity type in the prior art, though, removes the problem of additional power consumption. In the case of a chip having many pins, arrangement of the bonding pads becomes a big trouble because the connection points and each bonding pad should be specially arranged. Moreover, due to the large area of the boding pads, if the number of the bonding pads is large, the chip area will be unnecessarily increased using the bonding option of the power/ground proximity type, raising the production cost.

Compared to the prior art, the present invention utilizes a plurality of package substrates as the voltage supply or the ground to implement bonding option without increasing additional leads. Therefore, the present invention has the following advantages: 1. Provide convenient testing and other functions for a chip, and let a single chip operate in different modes. 2. Make it easier to arrange leads because only one lead is needed for providing the voltage of the power supply and the ground. 3. It is easier to use and maintain the bonding option. 4. Less number of leads to smaller layout area and lower production cost. The present invention reserves the advantages of the prior art and has additional advantages that the prior art cannot achieve.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A chip-packaging with bonding options having a plurality of package substrates, comprising:
    a first package substrate having a high voltage or a low voltage;
    a second package substrate having a high voltage or a low voltage, the voltage level of the first package substrate being the logical opposite of the voltage level of the second package substrate; and
    a chip mounted on first package substrate, the chip comprising a plurality of bonding option pads,
    wherein each bonding option pad of the chip is associated with at least two bonding options respectively provided by the first package substrate and the second package substrate, and each bonding option pad is connected to one of the first package substrate and the second package substrate.

2. The chip-packaging of the claim 1 wherein the high voltage is the voltage of the power supply and the low voltage is the ground voltage.

3. The chip-packaging of the claim 1 further comprising a plurality of leads, wherein each lead is connected to a high voltage, a low voltage, or an input/output signal.

4. The chip-packaging of the claim 1 wherein the first package substrate extends outside the chip and the second package substrate surrounds the chip.

5. The chip-packaging of the claim 1 wherein the first package substrate and the second package substrate substantially approximate each of a plurality of the bonding option pads.

6. The chip-packaging of the claim 1 further comprising a plurality of leads, each bonding option pad of the chip having a corresponding lead, wherein each bonding option pad is connected to one of the first package substrate, the second package substrate, and the corresponding lead.

7. The chip-packaging of the claim 1 wherein each bonding option pad is connected to one of the first package substrate and the second package substrate for determining the functionality of the chip.

* * * * *